(12) United States Patent
Khadilkar et al.

(10) Patent No.: US 9,272,497 B2
(45) Date of Patent: Mar. 1, 2016

(54) HERMETICALLY SEALED ELECTRONIC DEVICE USING COATED GLASS FLAKES

(75) Inventors: Chandrashekhar S. Khadilkar, Broadview Heights, OH (US); Robert P. Blonski, North Royalton, OH (US); Srinivasan Sridharan, Strongsville, OH (US); Jackie D. Davis, Cleveland, OH (US); John J. Maloney, Solon, OH (US); James D. Walker, Chagrin Falls, OH (US); Andrew M. Rohn, Jr., Clinton, OH (US)

(73) Assignee: Ferro Corporation, Mayfield Heights, OH (US)

(*) Notice: Subject to any disclaimer, the term of this patent is extended or adjusted under 35 U.S.C. 154(b) by 219 days.

(21) Appl. No.: 13/808,422

(22) PCT Filed: Jul. 22, 2011

(86) PCT No.: PCT/US2011/044920
§ 371 (c)(1),
(2), (4) Date: Mar. 6, 2013

(87) PCT Pub. No.: WO2012/012675
PCT Pub. Date: Jan. 26, 2012

(65) Prior Publication Data
US 2013/0164466 A1    Jun. 27, 2013

Related U.S. Application Data

(60) Provisional application No. 61/366,568, filed on Jul. 22, 2010.

(51) Int. Cl.
*B32B 37/12* (2006.01)
*B05D 3/00* (2006.01)
*C09D 5/34* (2006.01)
*C09D 7/12* (2006.01)
*H01L 31/048* (2014.01)
(Continued)

(52) U.S. Cl.
CPC .............. *B32B 37/12* (2013.01); *B05D 3/007* (2013.01); *C09D 5/34* (2013.01); *C09D 7/1291* (2013.01); *H01L 31/048* (2013.01); *H01L 31/0481* (2013.01); *H01L 31/0488* (2013.01); *C08K 7/14* (2013.01); *H01L 51/5246* (2013.01); *Y02E 10/50* (2013.01); *Y10T 428/1314* (2015.01)

(58) Field of Classification Search
CPC ........ B05D 3/007; C09D 5/34; C09D 7/1291; B32B 37/12; H01L 3/0488; H01L 31/048; H01L 31/0481
See application file for complete search history.

(56) References Cited

U.S. PATENT DOCUMENTS 4,334,354 A    6/1982  Luft et al.
4,636,578 A    1/1987  Feinberg
(Continued)

FOREIGN PATENT DOCUMENTS

WO    2004/056716 A1    7/2004

OTHER PUBLICATIONS

International Search Report for corresponding PCT/Us2011/044920 mailed Nov. 18, 2011, one page.

*Primary Examiner* — Daniel McNally
(74) *Attorney, Agent, or Firm* — Rankin, Hill & Clark LLP

(57) ABSTRACT

A glass-flake loaded organic sealant system is useful for sealing active layers such as those in electronic devices and solar cells.

15 Claims, 4 Drawing Sheets

(51) Int. Cl.
*C08K 7/14* (2006.01)
*H01L 51/52* (2006.01)

(56) References Cited

U.S. PATENT DOCUMENTS

| | | | |
|---|---|---|---|
| 5,017,207 A | 5/1991 | Watkinson et al. | |
| 5,436,077 A * | 7/1995 | Matsuba et al. | 428/404 |
| 5,958,590 A | 9/1999 | Kang et al. | |
| 7,318,861 B2 * | 1/2008 | Bagala et al. | 106/415 |
| 2005/0170180 A1 * | 8/2005 | Kawa | 428/402 |
| 2009/0130471 A1 * | 5/2009 | Saga | 428/477.7 |
| 2009/0153972 A1 * | 6/2009 | Nakamura et al. | 359/599 |
| 2009/0176112 A1 * | 7/2009 | Kruckenberg et al. | 428/457 |

\* cited by examiner

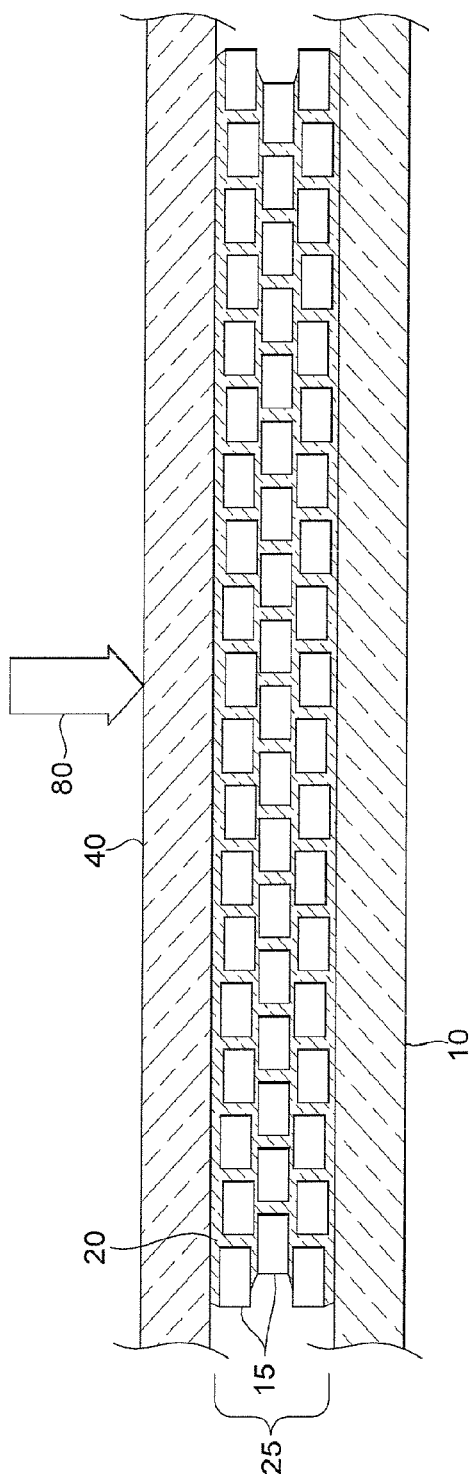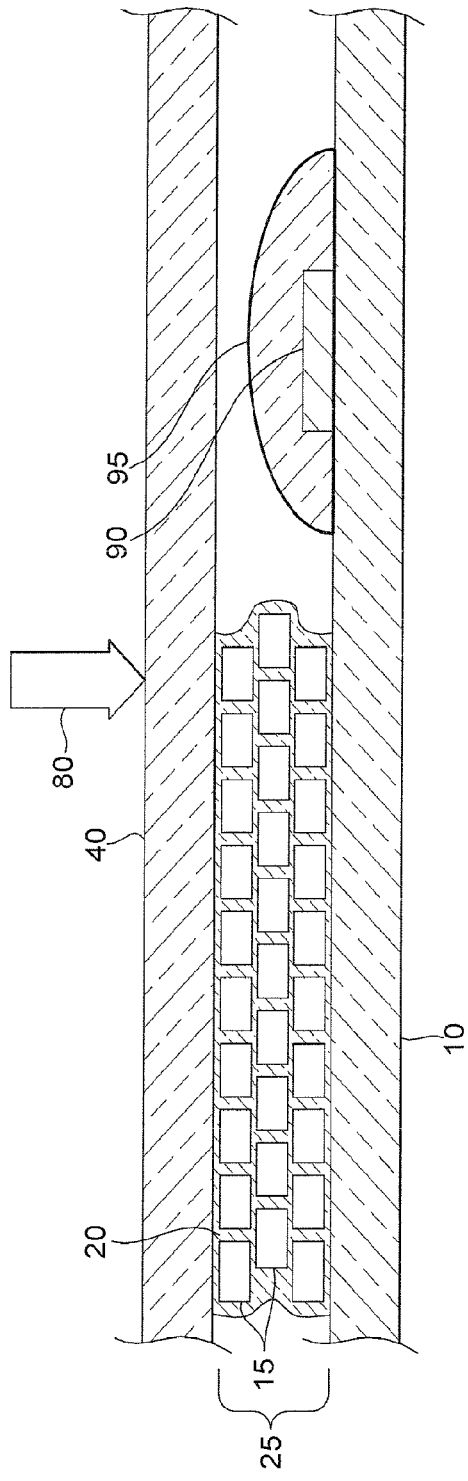

HERMETICALLY SEALED ELECTRONIC DEVICE USING COATED GLASS FLAKES

BACKGROUND OF THE INVENTION

1. Field of Invention

The present invention relates to a glass flake based hybrid hermetic sealing system useful in solar cells based on silicon, organic systems, and thin layer solar cells as well as other electronic devices such as organic LEDs (OLED).

2. Description of Related Art

Conventional formation of hermetic seals of electronic devices such as thin layer solar cells or OLEDs involves the application of organic pastes or tapes at the edges of the device followed by a thermal, ultraviolet light or chemically induced curing cycles. The organic sealants are not truly hermetic and sometimes contain getters to mitigate their non-hermeticity. Truly hermetic seals can be made from glass based systems by printing and firing a paste composition including a glass frit and organic solvent/binder system. Drawbacks of such systems include the need to fire at extremely high temperatures, e.g., 800° C., and the problem of entrapment of organic residue and incomplete burnout of the binder system (such as ethyl cellulose) within the hermetic seal. Such entrapment causes undesired contamination of active layers sealed, such as solar cells or OLEDs, within the hermetic seal.

Accordingly, improvements in the art of hermetic sealing are required.

Hybrid inorganic platelet filler organic matrix systems have been utilized to produce improved gas barrier layers primarily in the food packaging industry. Examples include U.S. Pat. No. 4,618,528 in which the platelet filler is preferentially talc, U.S. Pat. No. 4,818,782 in which the platelet filler is mica and U.S. 2011/0081534 in which the platelet filler is glass flakes.

BRIEF SUMMARY OF THE INVENTION

The present invention provides materials, seal designs, geometries and process steps for making hermetic seals, and simplifying the manufacture of hermetic seals which are used to protect active layers of electronic devices such as solar cells, LEDs, OLEDs, plasma display panels and the like.

A variety of substrates including those made of glass, metal, ceramic, and plastics, as well as those constituting active devices may be sealed together by this invention to create a hermetic seal in devices such as display devices (flat panel screens, LED screens, LCD screens, plasma display panels), organic light emitting diodes (OLEDs), solar cells and solar cell panels, and even windows for both architectural and automotive applications. The substrates may be coated with a coating such as conductive coated glass, indium tin oxide, aluminum doped zinc oxide, sputtered metals, antireflective coatings, $SiN_X$ coatings, $Si_3N_4$ coatings, and combinations thereof.

Organic sealants are inherently permeable to gases and vapors. While their permeability can be significantly reduced by orders of magnitude via formulation and curing processes, they have not reached the point of adequate hermeticity for some of the more demanding applications.

The lack of adequate hermeticity can be due to diffusion mechanisms at either of the two substrate-sealant interfaces, or through the sealant material itself. Many of the substrates such as glass, ceramics, and metal typically have an oxide coating that is polar by nature, and often hydroxylated to some extent. Therefore, these interfaces provide a natural pathway for moisture migration through the seal. The permeability of the organic sealants is most likely due to the lack of a strongly-bonded three-dimensional structure, with the weaker Van-der-Waals bonding being more susceptible to gaseous diffusion.

This invention targets mitigation of permeability to produce a superior quality seal with a greater degree of hermeticity. A hermetic seal consisting of an organic system containing a high loading of glass flakes can reduce the permeability of a pure organic system, both by reducing the percentage of the permeable fraction of the seal and by creating a so-called tortuous path for gaseous migration, where the diffusion path length is increased by orders of magnitude.

This invention also includes processes mitigating interfacial diffusion to further increase the hermeticity of the seal. The incorporation of additives to form covalent bonds to the substrates, as well as the glass flakes and other inorganic components, eliminates weakly bonded areas and polar pathways. While the glass flakes provide an extremely impermeable barrier, their surfaces typically do not wet well or bond well to organic systems and present a polar pathway. Pretreatment and functionalization of the glass flake surfaces enable good dispersion properties and hermetic bonding after curing.

Therefore an organic-inorganic hybrid hermetic seal consisting of an organic system, highly loaded with glass flakes mitigates the effect of unsatisfactory hermeticity of a pure organic system and at the same time avoids the relatively high temperature processing cycle needed to fuse a traditional glass frit based edge seal by maximizing the inorganic loading of the edge seal while also adding a tortuous diffusion path for deleterious atmospheric components such as oxygen and water vapor.

The organic matrix can be based on thermoplastic as well as thermosetting polymers. For example, organics such as thermoplastics, thermosets, ionomers, elastomers, polyethylene, polypropylene, polystyrene, polyvinyl chloride, polytetrafluoroethylene, acrylics, polyesters, silicones, polyurethanes, halogenated plastics, condensation plastics, polyaddition plastics, cross-linking plastics, PVB, PI, SRP, TPI, PAI, HTS, PFSA, PEEK, PPSU, PEI, PESU, PSU, fluoropolymers, LCP, PARA, HPN, PPS, PPA polyamides, polycarbonates, PC, PPC, COC, PMMA, ABS, PVC Alloys, PEX, PVDC, PBT, PET, POM, nylons UHMWPE, HDPE, LDPE, rubber, natural rubber, styrene-butadiene rubber, neoprene rubber, and combinations thereof.

Glass flakes can be made by several known methods. For example, a method of making glass flakes is described in U.S. Pat. No. 5,017,207 and PCT Pat. Pub. No. WO 2004/056716, both issued to Watkinson, both incorporated herein by reference. The glass flakes are typically thin and generally planar, having a thickness of less than 10 microns, preferably less than 5 microns, and most preferably less than 2 microns. The length and width of glass flakes can range from 0.1 to 2000 microns, and possibly 5-1000 microns, 10-500 microns, 20-400 microns, 25-250 microns, 30-200 microns, alternately 0.5-100 microns, or 1-100 microns, 5-90 microns and 10-80 microns. The desired width to thickness ratio can be greater than five, preferably greater than 10, more preferably greater than 20, still more preferably greater than 50, and alternatively, 2-50, 5-100 and 10-20.

The bond between the organic component and the glass flakes and surfaces to be sealed is critical. The glass flake is advantageously pre-treated and/or functionalized to allow good dispersion and hermetic bonding after curing. Yet another pretreatment useful to create hermetic edge seals is by using a hybrid sealing system which uses a glass flake composite including glass flakes which have been coated with a stable plastic or organic coating which can be ultrasonically bonded. Such a plastic or other organic coating must be able to withstand moderate heating, such as that produced by ultrasonic vibrations. Such a hybrid organic/inorganic sealing system (glass flakes+plastic or organic coating) can be compacted and oriented into a thin coating or tape or gasket. Out gassing and gas permeation must be prevented or minimized, hence very stable plastics are preferably used.

In any embodiment, the glass flakes may, independently of other functionalization, be colored or pigmented either for decorative purposes or to protect against UV degradation of the polymer component or index matching between the glass flakes and the polymer component. Alternately, or in conjunction with other embodiments, the glass flakes may be functionalized to have at least one appearance or behavior selected from the group consisting of metallic appearance, photosensitivity, dichroism, opalescence, interference, diffraction, luminescence, phosphorescence, and lotus effect.

The sealing process is critical for forming hermetic seals. In general, localized curing methods are preferred to prevent heating of the devices being sealed which are oftentimes temperature sensitive. Many types of radiation can be used so long as it can be localized and provides enough energy to thoroughly cure the seal. Among these, this invention particularly addresses use of UV-curing, curing with broadband or emission in the UV, visible, or near-infrared range, and laser sealing with wavelengths in either the UV, visible, or near-infrared range. The UV-radiation typically cures polymeric systems through free-radical or cationic polymerization processes containing the appropriate initiators. The visible and near-infrared processes typically require the addition of an appropriate radiation absorber to bring about a thermal cure of the seal.

DETAILED DESCRIPTION OF THE INVENTION

Figure 1A:
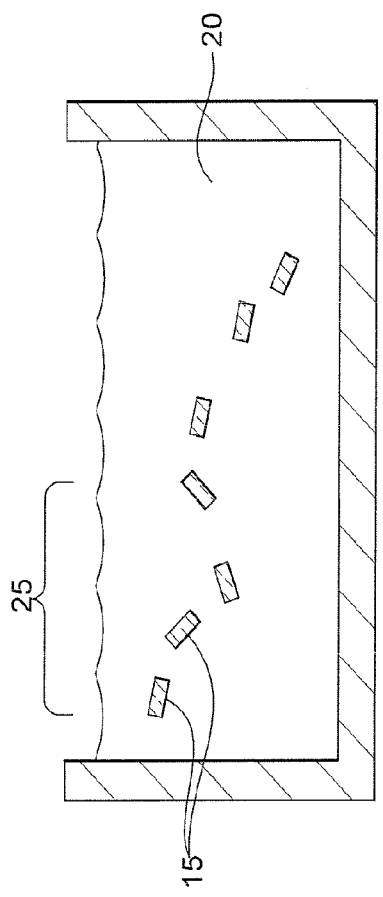
FIG. 1 shows the glass flake filled organic matrix of the invention and its use in forming a seal between two substrates.

The primary purpose of this invention is the formation of hybrid hermetic seals, defined as seals containing both organic and inorganic components. While organic sealants are inherently permeable to gasses and vapors, over the years their permeabilities have been reduced by orders of magnitude by optimizing their formulations, additives, processing techniques, and curing techniques. Still these optimized systems have permeabilities at least two orders of magnitude too high to satisfy the idealized level of hermeticity required for some of the more demanding applications.

The seals and materials of the invention can be used to form, in general, moisture barriers, hermetic seals, and gaskets. The moisture barriers are useful in protecting electric and electronic devices such as solar cells and solar cell modules. Moisture barriers are especially useful in protecting flexible devices or an array of devices when the array is flexible. Hermetic seals are suited to form sealed cavities between relatively inflexible substrates, such as glass or metal panels, or other organic or inorganic substrates. Gaskets are often formed in place between irregularly shaped substrates or objects to be sealed together.

The inventors herein have identified some of the factors inhibiting the achievement of higher levels of hermeticity for polymeric based sealants and have discovered new approaches, new materials, new seal geometries, and new processes that can be used to improve the hermeticity of organic-inorganic hybrid seals. With a few exceptions, inorganic materials are generally hermetic, with dense, strongly-bonded structures. Addition of inorganic components reduces the permeable fraction of the hybrid seal, increasing its hermeticity. Further enhancement of the hermeticity occurs when these inorganic components, especially flaked particles are aligned perpendicular to the diffusion path and are at a high enough concentration to create a manifold increase in pathlength for the diffusing gases.

The use of high levels of inorganic components such as glass flakes in organic sealing systems introduces a significant amount of additional interfacial areas that are more prone to permeation, partially off-setting the improvements due to the addition. Therefore, this invention also embodies the surface treatment of glass flakes, the substrates, and other inorganic components, when necessary, in order to provide covalent bonding between the glass flakes and an organic sealant.

The inventors herein have discovered that pre-wet and/or coated glass flakes could result in a hermetic seal with improved barrier properties as compared to conventional organic seals. The glass flake, especially those consisting of UV absorbing cations such as titanium, cerium, transition and rare earth metals, also impart significant UV protection to the organic matrix. The glass flakes also yield significantly improved structural and flexural characteristics to the seal.

The organic system can be based on both thermoplastic as well as theiniosetting polymers. For example, plastics such as, polyethylene, polystyrene, polyvinyl chloride, polytetrafluoroethylene, acrylics, polyesters, silicones, epoxies, polyurethanes, halogenated plastics, condensation plastics, polyaddition plastics, and cross-linking plastics, PVB, PI, SRP, TPI, PAI, HTS, PFSA, PEEK PPSU, PEI, PESU, PSU, fluoropolymers, LCP, PARA, HPN, PPS, PPA polyamides, polycarbonates PC, PPC, COC, PMMA, ABS, PVC Alloys PEX, PVDC, PBT, ET, POM, nylons UHMWPE PS, PVC PP, HDPE, LDPE and combinations thereof.

Preferred organic materials, either as the organic matrix into which the glass flakes are mixed, or as the functional coatings on the glass flakes to improve their adhesion to substrates, include polyvinyl butyral (PVB) such those sold under the Butvar® trademark, available from Solutia, St. Louis, Mo., or Liquid Nails®, available from Akzo Nobel, Strongsville, Ohio.

Glass flakes can be made by several known methods. For example, a method of making glass flakes is described in U.S. Pat. No. 5,017,207 and PCT Pat. Pub. No. WO 2004/056716, both issued to Watkinson, both incorporated herein by reference. The glass flakes are typically thin and generally planar, having a thickness of less than 20 microns, preferably less than 10 microns, more preferably less than 5 microns, more preferably less than 2 microns and more preferably less than 1 micron. The length and width of glass flakes can be the same or different and can range from 0.1 to 2000 microns, and possibly 5-1000 microns, 10-500 microns, 20-400 microns, 25-250 microns, 30-200 microns, or 0.5-80 microns, alternately 1-100 microns, 5-90 microns and 10-80 microns. The longest dimension is typically defined to be length. Aspect ratio is defined herein as length to thickness (longest to shortest dimension of a flake). The desired aspect ratio is greater than five, preferably greater than 10, more preferably greater than 20, still more preferably greater than 50, even more preferably greater than 100, and alternatively, 2-50, 2-100, 5-100 and 10-20.

The hybrid glass flake organic matrix composite can be applied as either a paste or a tape using standard deposition/application procedures or as a preform such as gasket seal. That is a preform of the seal can be made separately out of this hybrid glass flake organic matrix composite. Subsequently the preform can be placed in place between the surface to be sealed to make the seals. The glass flake loaded curable organic material can be applied to at least one substrate by a procedure selected from the group consisting of tape casting, doctor blading, layer by layer application, screen printing, spraying, ink jet printing and combinations thereof.

An active layer to be protected by the seals and barriers of the invention include solar cell, solar cell contact, organic PV device, plasma display device, nanocrystal display, electrochromic device, electrochromic material system, suspended particle device, micro-blind, liquid crystal device, smart window, switchable window, smart glass, eglass, or display technologies such as LED, SED, FED, OLED, LCD, DLP, FLD, IMOD, TDEL, QDLED, TMOS, TPD, LCL, LPD, or OLET. It is the active layer 90, 120, 220, 320 that is ultimately protected by the barrier, hermetic seal, gasket, or encapsulant of the invention. Products including those sold under the Sageglass® and SunValve™ product names or trademarks are envisioned as active layers or active devices useful herein.

An embodiment of the invention is a method of forming a barrier, comprising: (a) providing a glass flake loaded curable organic material comprising (i) at least one curable organic material, and (ii) 5-95 vol % glass flakes based on the volume of organic material, (b) applying the glass flake loaded curable organic material to at least one first substrate, (c) contacting a second substrate with the at least one first substrate such that the glass flake loaded curable organic material lies therebetween, and (d) curing the curable organic material to form a cavity protected by a barrier, wherein the glass flakes have an aspect ratio of 2-100 and a length of 0.1-2000 microns.

Another embodiment of the invention is a method of forming a barrier, comprising: (a) providing a glass flake loaded curable organic material comprising (i) at least one curable organic material, (ii) 5-95 vol % glass flakes based on the volume of organic material, (b) applying the glass flake loaded curable organic material to at least one first substrate, and (c) curing the curable organic material to form a barrier, wherein the glass flakes have an aspect ratio of 2-100 and a length of 0.1-2000 microns.

An embodiment of the invention is a sealed assembly comprising at least one cavity, the cavity formed by at least two substrates sealed together with a cured composition comprising, prior to curing (a) at least one curable organic material, and (b) 5-95 vol % of glass flakes based on the vol % of organic material, wherein the glass flakes have a length of 0.1 to 2000 microns and an aspect ratio of 2-100.

An embodiment of the invention is a method of hermetically sealing an object, comprising: (a) providing a glass flake loaded curable organic material comprising (i) at least one curable organic material, (ii) 40-70 vol % glass flakes based on the volume of organic material, (b) applying the glass flake loaded curable organic material to the at least a portion of the surface of the object and (c) curing the curable organic material to form a film or sheet over at least a portion of the surface of the object, wherein the glass flakes have an aspect ratio of 2-100 and a length of 0.1-2000 microns.

Yet another embodiment of the invention is a method of forming a solar cell module comprising: (a) laying down in a frame, in order: (i) a backsheet layer, (ii) an adhesive layer, (iii) at least one solar cell, (iv) a transparent pottant layer and (v) a transparent superstrate layer, to form an assembly, wherein (b) at least one of the layers includes a glass flake loaded curable organic material comprising: (i) at least one curable organic material, and (ii) 5-95 vol % glass flakes based on the volume of organic material, wherein the glass flakes have an aspect ratio of 2-100 and a length of 0.1-2000 microns, and (c) curing the at least one curable organic material by applying an energy source selected from the group consisting of thermal curing, broadband infrared, laser, flame induction, ultrasound, natural gas burners, magnetic induction heating, and eddy currents.

Still another embodiment of the invention is a method of forming a solar cell module comprising: (a) laying down in a frame, in order: (i) a backsheet layer, (ii) a backside pottant layer, (iii) at least one solar cell, (iv) an adhesive layer and (v) a transparent superstrate layer, to form an assembly, wherein at least one of the layers includes a glass flake loaded curable organic material comprising: (i) at least one curable organic material, and (ii) 5-95 vol % glass flakes based on the volume of organic material, wherein the glass flakes have an aspect ratio of 2-100 and a length of 0.1-2000 microns, and (c) curing the at least one curable organic material by applying an energy source selected from the group consisting of thermal curing, broadband infrared, laser, flame induction, ultrasound, natural gas burners, magnetic induction heating, and eddy currents.

Yet another embodiment of the invention is a method of forming a solar cell module comprising: (a) laying down in a frame, in order: (i) a backsheet layer, (ii) a first encapsulant layer, (iii) at least one solar cell, (iv) a second encapsulant layer and (v) a transparent superstrate layer, to form an assembly, wherein (b) at least one of the layers includes a glass flake loaded curable organic material comprising: (i) at least one curable organic material, and (ii) 5-95 vol % glass flakes based on the volume of organic material, wherein the glass flakes have an aspect ratio of 2-100 and a length of 0.1-2000 microns, and (c) curing the at least one curable organic material by applying an energy source selected from the group consisting of thermal, UV, visible, laser, broadband infrared laser, flame induction, ultrasound, natural gas burners, magnetic induction heating, and eddy currents.

Still another embodiment of the invention is a hermelically sealed device comprising: (a) at least two substrates, (b) a cured glass flake loaded organic material between at least a portion of the at least two substrates, the material comprising (i) at least one curable organic material, and (ii) 5-95 vol % glass flakes based on the volume of organic material, (c) the at least two substrates and cured glass flake loaded curable organic material forming a hermetically sealed cavity, wherein the glass flakes have an aspect ratio of 2-100 and a length of 0.1-2000 microns.

Figure 1B:
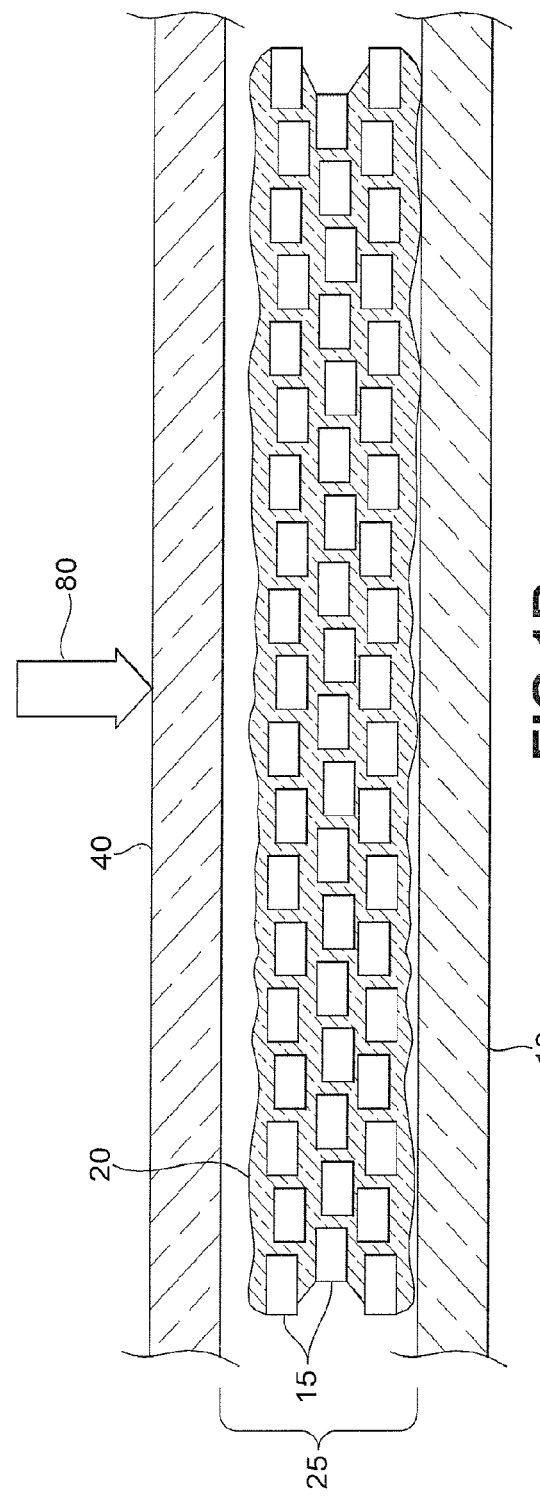

Generally, as shown in FIG. 1A, a plurality of functionalized glass flakes 15 can be dispersed in the organic matrix (precursors) 20. The glass flakes 15 and organic matrix 20, forming a glass-flake-filled matrix 25 are then applied to a bottom substrate 10, for example as in FIG. 1B, and the flakes tend to align more or less into the same orientation, with the long axis of the flakes parallel to the substrate. A top substrate 40 is placed over the glass flakes. As shown in FIG. 1C, a compacting energy source such as ultrasound or isostatic pressure (either indicated by arrow 80), either optionally with heat, is applied to melt, flow, and cure the organic matrix from each flake together and to further align the glass flakes 15 parallel to the substrates. The resulting cured glass-flake-filled matrix 25 seals the substrates 10 and 40 together (optionally hermetically) to form a barrier, as shown in FIG. 1D. FIG. 1D is also shown with active layer 90 that may be present with or without EVA or other film 95 thereon. Active layer 90 and EVA layer 95 is shown only in FIG. 1D but can also be envisioned in the steps of FIGS. 1B and 1C.

A variety of seal geometries are possible. For example, a seal may be formed between a bottom glass substrate, a preformed edge of a top glass substrate and along side the ends of an active layer (such as an OLED) and plastic (EVA or other film) layer as shown in FIG. 1D.

Figure 2:
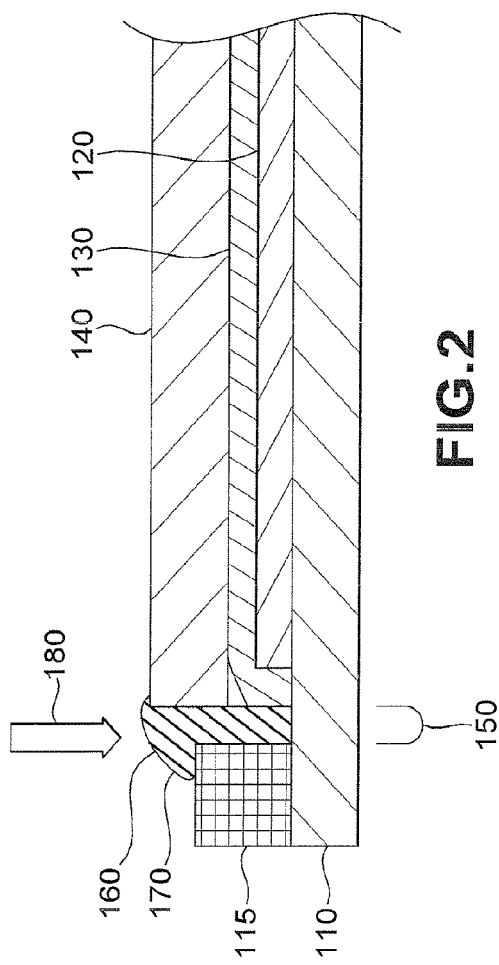
FIG. 2 shows the formation of a hermetic seal between two substrates, one of which includes a preformed edge.

In FIG. 2, a schematic depiction of a portion of a generalized hermetically sealed PV device is shown. Therein a bottom glass substrate 110 includes an integral preformed edge 115, which may be added by melting or firing a portion of the bottom glass substrate 110 or may be formed by properly cutting and shaping a sufficiently thick block of glass to become preformed edge 115 integral with bottom glass substrate 110. Alternately, seal material, such as those described above or a firable enamel is printed or otherwise applied to at least one substrate 110, 140 and then fired to sinter to form integral preformed edge 115. The firing may be undertaken during a glass tempering cycle.

An active layer 120 is positioned on top of the glass substrate. Next, a polymer film 130 is laminated to at least one of the active layer 120 and the top glass substrate 140. The top glass substrate 140 is placed in close contact with the active layer 120. In all embodiments, the terms "top" and "bottom" are relative and meant to show opposition only. Any spatial arrangement is envisioned.

A gap 150 between preformed edge 115 and the edges of active layer 120, polymer film 130 and top glass substrate 140 is left to allow a seal material 160 to be filled in. Hybrid seal material 160 is an organic matrix loaded with glass powder or flakes. The glass flakes are typically thin and generally planar, having a thickness of less than 20 microns, preferably less than 10 microns, more preferably less than 5 microns, more preferably less than 2 microns and more preferably less than 1 micron. The length and width of glass flakes can be the same or different and can range from 0.1 to 2000 microns, and possibly 5-1000 microns, 10-500 microns, 20-400 microns, 25-250 microns, 30-200 microns, alternately 1-100 microns, 5-90 microns and 10-80 microns. The longest dimension is typically defined to be length. Aspect ratio is defined herein as length to thickness (longest to shortest dimension of a flake). The desired aspect ratio is greater than five, preferably greater than 10, more preferably greater than 20, still more preferably greater than 50, even more preferably greater than 100, and alternatively, 2-50, 2-100, 5-100 and 10-20.

Alternately the glass flakes may be considered particles characterized by a single size dimension, such as average particle size $D_{50}$. Such size can be determined on a laser scattering system provided by Horiba Scientific, Kyoto Japan, such as a reticle/mask particle detection system PR-PD2HR, PR-PDS, PR-PD2 or PR-PD3. The $D_{50}$ of the glass flakes preferably falls within the range 20 nanometers to 50 microns, preferably 50 nanometers to 20 microns, more preferably 75 nanometers to 10 microns.

In other embodiments, the hybrid seal can contain glass flakes having $D_{50}$ particle sizes up to 2000 microns, 1-200 microns, preferably 5-90 microns, more preferably 10-80 microns or any value in between. The thickness of the glass flakes can be between 10 microns and 50 nanometers, preferably between 5 microns and 75 nanometers, and most preferably between 2 microns and 100 nanometers.

A localized or dispersed energy source 180 can be used to melt and flow seal material 160 to fully fill gap 150 thereby forming solid seal 170. Suitable localized energy sources include UV, visible light, broadband infrared curing or heating sources, laser, flame induction, or combinations thereof. Dispersed energy sources include thermal curing, ultrasound, natural gas burners, magnetic induction and eddy current heating sources.

Figure 3:
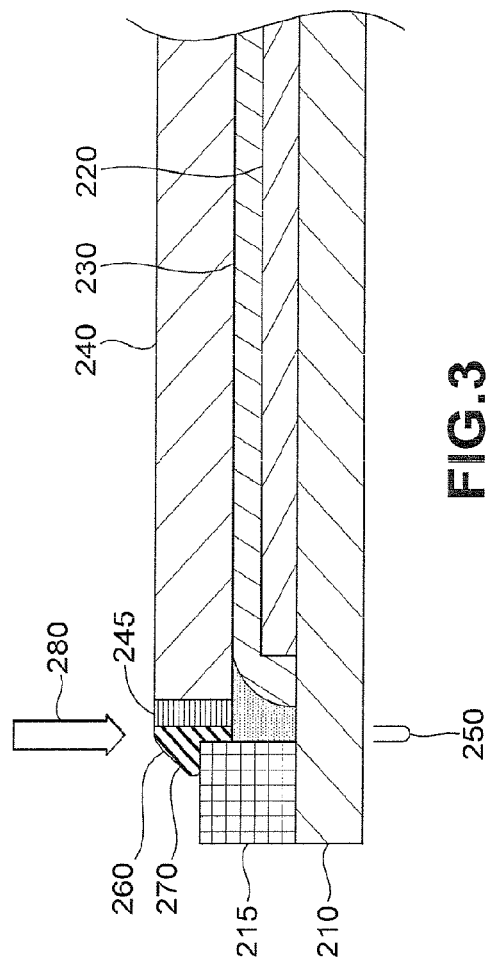
FIG. 3 shows the formation of a hermetic seal between two substrates, one of which includes a preformed edgeband.

A third seal geometry is shown in FIG. 3, which is a variation of that depicted in FIG. 2. Reference numerals in FIG. 3 have 100 added to the reference numerals of FIG. 2 for those features in common.

Therefore FIG. 3 depicts a variation of a generic hermetically sealed electronic device, similar to FIG. 2. Bottom glass substrate 210 includes integral preformed edge 215 which may or may not be formed from a solid piece of glass as discussed with respect to FIG. 1. If not formed from a single piece of glass, then a sealing material (enamel) may be printed on the edge of bottom glass substrate 210 to form preformed edge. A suitable enamel is printed or otherwise applied to the edge of the bottom 210 and top 240 glass substrates. The top 210 and bottom 240 glass substrates are then fired during a tempering cycle to make edge 215 and edge band 245, respectively. A thermoplastic material such as EVA is laminated to top glass substrate 210 covering active layer 220 and laminated to bottom glass substrate 240, both when pressed together to form film layer 230. A gap 250 is left between preformed edge 215 and edgeband 245 into which a seal material 260 such as a hybrid glass flake system (described elsewhere herein) are added. A seal 270 is formed by heating seal material 260 with a localized energy source 280 which may be any disclosed herein.

Figure 4:
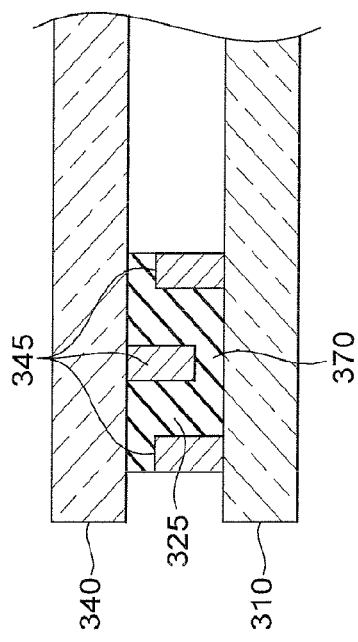
FIG. 4 shows the formation of a hermetic seal between two substrates, at least one of which includes inorganic ridges.

FIG. 4 is another variation of hybrid seal having additional tortuous path built in the form of inorganic ridges 345 formed on both bottom substrate 310 and top substrate 340. One or more ridges of inorganic material, such as a glass frit, 345 is formed near the edge of a respective substrate (310, 340). Ridges 345 are formed by depositing, such as by printing, and then firing, a paste of a glass frit and vehicle as disclosed herein. Multiple such ridges can be printed alternately at appropriate intervals on opposing substrates, such as 1, 2, 3, 4, 5, or more ridges on each substrate so that when the substrates are brought into close proximity to one another the ridges form something of a sieve.

During an assembly process similar to that described in FIG. 1 and accompanying test, now shown in FIG. 4, glass filled matrix 325 can be filled in between successive ridges 345 and then substrates 310 and 340 pressed together. Ridges 345 attached to a respective substrate (310, 340) can be positioned in contact or almost in contact with the opposite respective substrate (340, 310). The matrix 325 can be cured by localized or dispersed energy as discussed hereinabove to form cured polymer seal 370.

Advantages of the construction and heating schemes of FIGS. 2 to 4 are at least two-fold. Because the sealing material is substantially inorganic, there is no need to remove an excessive amounts of organic binder as is often the case with conventional printed, dried, and fired pastes. Second, because the sealing material is heated locally, the substrate is not heated, and there is little or no problem with overheating and cracking the substrate.

As an active layer (90, 120, 220, 320), solar cells can be fabricated into modules, and sealed together with the processes disclosed herein. Solar cells are generally made of semiconductor materials, such as silicon (Si), which convert sunlight into useful electrical energy. A solar cell assembly is in general made of thin wafers of Si in which the required PN junction is formed by diffusing phosphorus (P) from a suitable phosphorus source into a P-type Si wafer. The side of the silicon wafer on which sunlight is incident is generally coated with an anti-reflective coating (ARC) to prevent reflective loss of sunlight. This ARC increases the solar cell efficiency. A two dimensional electrode grid pattern known as a front contact makes a connection to the N-side of silicon, and a coating of predominantly aluminum (Al) makes connection to the P-side of the silicon (back contact). Further, contacts known as silver rear contacts, made out of silver or silver-aluminum paste are printed and fired on the N-side of silicon to enable soldering of tabs that electrically connect one cell to the next in a solar cell module. These contacts are the electrical outlets from the PN junction to the outside load. For thin film solar cell assemblies the active elements can be based on other semiconductors such as amorphous silicon, cadmium tellurides, or copper indium gallium selenides. Often these thin film substrates are built on top glass or metal substrates depicted as top or bottom substrate in FIGS. 2 to 4.

Another embodiment is the use of gasket seals made with the hybrid sealing system of this invention. Processes such as extrusion enhance the layering alignment of flakes, and the gasket can then be aligned within the seal to enable the improved hermeticity by forming a tortuous path.

A major advantage of the hybrid seal over a hermetic glass seal is the use of relatively low curing temperature of the seals. This is especially important for sealing temperature sensitive devises such as second- and third-generation solar cells. As a result of the low-temperature or even room-temperature curing, crack formation in the substrate and overheating of the device are non-issues.

Most organic materials are susceptible to UV-degradation, especially in outdoor exposures such as those to be expected for solar cells, which would result in compromised hermeticity. An embodiment of the current invention is the incorporation of UV-absorbing ions, such as titanium, cerium, and other transition metal and rare earth metal oxides, in the glass flake composition to impart significant UV protection to the polymeric, continuous phase. This would be advantageous for the directly or indirectly thermally cured polymeric systems using absorption of visible, near-infrared, or direct heating.

Figure 5:
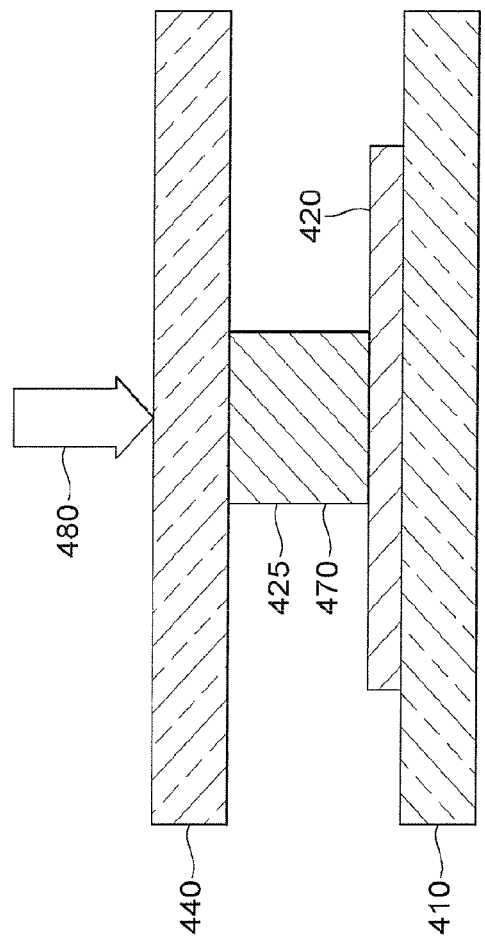
FIG. 5 shows the formation of a hermetic seal between two substrates encompassing a feedthrough therebetween.

FIG. 5 depicts an embodiment of the invention, which is a process for producing a hermetically sealed feedthrough. Feedthrough 420 is positioned in contact with and generally along bottom substrate 410. Onto top substrate 440 a ridge of glass flake filled polymer 425 is formed. Using pressure 480, bottom substrate 410 and top substrate 440 are pressed together such that glass flake polymer 425 contacts feedthrough 420. Localized or dispersed energy is applied to cure the polymer therein fowling a seal 470 having a feedthrough.

Other embodiments of the invention involve localized energy deposition in order to wet and flow a sealing material such as a plastic coated glass flakes. Such localized energy deposition may include infrared heating, ultrasound as well as laser firing, disclosed elsewhere herein.

An embodiment of the invention includes, in particular, a process of hermetically sealing a conductive feed through comprising: (a) pre-treating the conductive feedthrough to enable a hermetic bonding to the organic matrix (b) encapsulating the conductor in the glass flake hybrid composite sealant and processing the hermetic hybrid edge seal as noted above. Pressure may be applied to lest one of the substrates. Suitable substrates include glass, conductive coated glass, indium tin oxide, aluminum doped zinc oxide, sputtered metals, antireflective coatings, $Si_3N_4$ coatings, and combinations thereof.

Another embodiment of the invention is a method of forming a barrier, comprising: (a) providing a glass flake loaded curable organic material comprising (i) at least one curable organic material, (ii) 5-95 vol % glass flakes based on the volume of organic material, (b) applying the glass flake loaded curable organic material to at least one first substrate, and (c) curing the curable organic material to form a barrier, wherein the glass flakes have an aspect ratio of 2-100 and a length of 0.1-2000 microns. In this method a second substrate may be contacted with the at least one first substrate such that the glass flake loaded curable organic material lies therebetween. The barrier may form a cavity, and the cavity may be hermetic.

Organic system: A number of organic components exist in a typical photovoltaic(PV) module, such as seals, encapsulants, adhesives, backsheets, pottants and frames. The latter five terms are used herein as defined in Michelle Poliskie, Solar Module Packaging, CRC Press, 2011, especially beginning at section 2.2 on page 22. The entire contents of the Poliskie book are incorporated by reference herein. Consequently wide varieties of polymeric materials are used depending on its function in a given photovoltaic module. Improved resistance to weathering is essential for all these systems. Consequently incorporation of glass flakes in all these polymeric systems will increase the weathering resistance and hence can be taught of as embodiments of this invention. Broadly speaking some of these can be extruded as moisture resistant back sheet; some others can be used as encapsulants on top of photovoltaic cells; yet some others can be used as adhesives; still some others can be used as improved moisture resistant hybrid sealants. The most preferred embodiments are (a) hybrid seals between two substrates that form the protective enclosure for the PV device inside; (b) moisture resistant hybrid barrier coatings for encapsulants of solar cells.

In particular, an embodiment of the invention is a method of forming a solar cell module comprising (a) laying down in a frame, in order: (i) a backsheet layer, (ii) a backside pottant layer, (iii) at least one solar cell, (iv) an adhesive layer and (v) a transparent superstrate layer, to form an assembly, wherein at least one of the layers includes a glass flake loaded curable organic material comprising: [a] at least one curable organic material, and [b] 5-95 vol % glass flakes based on the volume of organic material, wherein the glass flakes have an aspect ratio of 2-100 and a length of 0.1-2000 microns, and (b) curing the at least one curable organic material by applying an energy source selected from the group consisting of laser, broadband infrared laser, flame induction, ultrasound, natural gas burners, magnetic induction heating, and eddy currents. In an alternate embodiment, the assembly may be formed by laying down in a frame, in order: (i) a backsheet layer, (ii) a first encapsulant layer, (iii) at least one solar cell, (iv) a second encapsulant layer and (v) a transparent superstrate layer. In yet another alternative embodiment, the assembly may be formed by laying down in a frame, in order, (a) a backsheet layer, (b) an adhesive layer, (c) at least one solar cell (d) a transparent pottant layer and (e) a transparent superstrate layer. In any embodiment, the glass flake loaded curable organic material may be subjected to an ultrasonic horn in order to at least partially align the flakes generally parallel to the other layers.

Some of the potential chemistries that can be used as resin materials are, a) thermoplastic (vinyl based), such as ethylene vinyl acetate co polymer used as encapsulants (eg. Elvax®

(Dupont), Encapsolar® (Stevens Urethane)); polyethylene terephthalate used as backsheet ((Rynite®, Mylar®, Melinex® (all from Dupont)); polyvinyl fluoride used as backsheet (eg. Tedlar® (Dupont) or b) thermosetting such as i) Epoxy resins—dicyandiamide curing agent, ii) polyimides, iii) Polyester, iv) Hybrid-Epoxy polyester, v) polyurethane, vi) cyanate esters, and vii) acrylics, such as polyethylene-b-polymethacrylic acid salt-b-polymethylacrylate used as encapsulant (eg. Suryln® (Dupont)), and vii) elastomers such as polydimethylsiloxane used as encapsulants (e.g., Sylgard®, (Dow Corning)).

For hybrid sealing in this invention it is envisioned that a glass flake loaded polymeric system, when cured, will transform to a solid-like hybrid system. For these a number of adhesives used in the industry can be utilized as well as a number of curing methods—such as UV curing, thermal curing as well as reactive cross link formation—can be used to effect the seals. In adhesive foimulations high molecular weight resins provide the back bone of the polymeric seal system. In this sense a number of resin systems can be used, such as—for rubber based adhesives elastomers such as natural rubber, butyl rubber, styrene-butadiene rubber, nitrile rubber and polychloroprene rubbers can be used; Polyvinyl butral resins such as Butvar® from Solutia corporation can be used; combination of Butvar® resins with thermosetting resins such as epoxy resins, phenolic resins can be used; Epoxy resins with amine curing agents can be used; UV curable adhesive resins such UV610 from Permabond Engineering Adhesives can also be used. Heat curing adhesives such as Dow Corning EA 6052 can also be used. Examples for chemically curing sealants—that can be used for the organic part of this hybrid sealing systems—are of types silicones, polyurethane or polysulfides.

In a typical adhesive formulations apart from resins that give the back bone structure in the resultant solid polymeric material a number of additional components such as tackifying resin (those listed in commonly-owned U.S. Pat. No. 7,547,369) can be also be used.

Other components useful as adhesives in the systems of the invention include inorganic oxides such as ZnO, MgO powders, antifoaming agent, antioxidant may be added to provide the workable adhesive formulation. It is envisioned that glass flakes can be added to these adhesive systems to provide the hybrid seals of this invention.

Modifications of glass flakes surfaces by organic coatings to promote adhesion and wetting by organic matrix in hybrid system are another embodiment of this invention. Basically these organic coatings, for eg. Silane coupling agents, have a general structure of R—Si(OR$_1$)$_3$ where R is an organofunctional group such as vinyl or epoxy or amine, and R$_1$ is an organic group such as alkoxide group which can be hydrolyzed. The hydrolysable groups react with the hydroxyls on the glass surface and attach to the glass surface on one end and have an organofunctional group on the other end. This organofunctional group on the free end of the silane coating reacts with the polymer matrix promoting better bonding with the organic matrix of the hybrid coatings. Depending on the organofunctional groups a number of silanes can be used. Some of the representative silane coupling agents useful for this invention can have organofunctional groups—such as vinyl, alkyl, phenyl, perfluoroalkyl, methacrylate, amine, epoxy, choloropropyl, Mercapto, Cationic styryl, titanate. Isocyanuarate. Other commercially available silane coupling agents for example those sold by Gelest, Inc, can be used.

In general, the glass flakes of the invention may be functionalized by the application to the glass flakes of at least one of adhesion promoting primers; coupling agents; organotitanate coupling agents; silane coupling agents selected from the group consisting of vinyl, chloropropyl, epoxy, methacrylate, primary amine, diamine, mercapto, cationic styryl, cationic methacrylate, titanate, crosslinker, mixed silanes and melamine epoxy; rubber elastomers selected from the group consisting of natural rubber, butyl rubber, styrene-butadiene rubber, nitrile rubber, neoprene rubber.

The inventors note that the requirements for the glass compositions for the flakes used in hybrid sealing are not very demanding other than they should possess viscosity temperature curves suitable to be made into thin flakes. Also these compositions should have good water durability. Although lead based compositions can be used it is preferred that these glasses are lead free. So suitable glasses can come from diverse glass systems, such as silicate glasses, borate glasses, phosphate glasses, zinc based glasses, bismuth based glasses, bismuth-zinc glasses, alkaline earth based glasses especially barium based glasses, and alkali silicate glasses. Exemplary glass flakes can be made from Ferro Corporation's wide range of glass offerings such as porcelain enamel glasses, tile glaze glasses and predominately zinc based glasses such as S46/6 glass. In certain instances the glass flakes can be colored with coloring oxides to block or mitigate the weathering of organics by UV radiation, thus extending the life time of the seals. Glasses can be chosen to match coefficients of thermal expansion (CTE) between the substrates (if glass) and the flakes in the range of 50 to 200×10$^{-7}$/° C., alternately 75-175×10$^{-7}$/° C., alternately 100-150×10$^{-7}$/° C. Glasses can be chosen to match refractive indices of the flakes to the polymer to improve transparency of the assembly.

Another embodiment of this invention is the amount of glass flakes loading in the hybrid glass flakes loaded polymeric hybrid system. It is envisioned that, apart from technological consideration, the eventual application for this hybrid system in the photovoltaic assembly, such as moisture barrier enhanced backsheets or moisture barrier enhanced encapsulants or moisture barrier enhanced seal materials determine the amount of glass flakes loading. Further the application method, such as layer-by-layer deposition, spraying, spin coating, dipping, screen printing, tape casting, doctor blading will determine the glass flakes loading.

The desired loadings are, 1-95 vol % (for deposition techniques such as layer by layer deposition), preferably 1-80 vol %, more preferably 10-80 vol %, still more preferably 30-80 vol %, and most preferably 40-70 vol %. In alternate embodiments, loadings of 10-40 vol % are useful.

All ranges disclosed herein are to be understood to encompass the beginning and ending range values and any and all sub ranges therein. For example, a stated range of "1 to 10" should be considered to include any and all sub ranges between (and inclusive of) the minimum value of 1 and the maximum value of 10; that is, all sub ranges beginning with a minimum value of 1 or more and ending with a maximum value of 10 or less, e.g., 1.0 to 2.7, 3.3 to 8.9, 5.7 to 10, etc. A limitation such as "at least one selected from the group consisting of" is intended to provide support for "at least two," "at least three," and so forth up to and including an embodiment including all elements in such a list.

In the following examples commercially available resins, Solutia Butvar® 98, 158C121 and LN903 (both from Akzo Nobel) were mixed with commercially available ECR glass flakes (Grade GF100 nm), from Glassflake Ltd., Leeds, England, and organic solvents such as toluene, ethanol and/or acetone to give glass-flake-loaded-polymeric hybrid coating slurry.

Sample A: 3.5 gm of Butvar B-98 resin, 3.5 gms of ECR glass flakes (Grade GF100 nm), and 3 gms of 1:1 Toulene/

Ethanol mixture were mixed together, in a high speed mixer at 3500 rpm (for 1 min 5 times) to obtain the hybrid coating slurry. Then the slurry was coated on two clean 3"×3"×3.2 mm glass slides (on the non-tin side) using a 5 mil gap doctor blade. Then the slides were dried at 80° C. for 1 hr to drive off the solvents. Then the slides were put on top of each other so that the hybrid coating sides were in contact. Then the assembly was heated to 171° C. and held for 20 min and then furnace cooled to get a sealed assembly. This hybrid sealed glass coupons assembly was immersed in a blue dye solution (1 gm of Reactive blue 4 from Sigma Aldrich dissolved in 300 ml of DI water) and left for 24 hr. At the end of 24 hrs the assembly was visually as well as under low power microscope for blue dye penetration in the hybrid seal in between the glass coupons. The blue dye did not penetrate into the seal and thus the assembly passed the dye test.

Sample B: 8.5 gm of LN903 resin from Akzonobel, 1.5 gms of ECR glass flakes (Grade GF100 nm), and 1.73 gms of toluene were mixed together, in a high speed mixer at 3500 rpm (for 1 min 5 times) to obtain the hybrid coating slurry. Then the slurry was coated on two clean 3"×3"×3.2 mm glass slides (on the non-tin side) using a 5 mil gap doctor blade. Then the slides were vacuum dried at 50° C. for 2 minutes to drive off the solvents. Then the slides were put on top of each other so that the hybrid coating sides were in contact. Then the assembly was left at room temperature (~25° C.) and held for 24 hrs to get a sealed assembly.

This hybrid sealed glass coupons assembly was immersed in a blue dye solution (1 gm of Reactive blue 4 from Sigma Aldrich dissolved in 300 ml of DI water) and left for 24 hr. At the end of 24 hrs the assembly was visually as well as under low power microscope for blue dye penetration in the hybrid seal in between the glass coupons. The blue dye did not penetrate into the seal and thus the assembly passed the dye test.

Sample C, 0.74 gm of resin 158C121 (from Akzo Nobel) was first screened through 250 mesh screen on top of the 3"×3"×3.2 mm glass coupon (on non-tin side), and then 0.09 gms of ECR glass flakes (Grade GF100 nm) were screened through 250 mesh screen on top of the 1580121 resin. Then a second glass slide was put on top of the screened resin+glass flakes coating. Then the assembly was heated at 177° C. for 60 min and then furnace cooled to get a sealed assembly. This hybrid sealed glass coupons assembly was immersed in a blue dye solution (1 gm of Reactive blue 4 from Sigma Aldrich dissolved in 300 ml of DI water) and left for 24 hr. At the end of 24 hrs the assembly was visually as well as under low power microscope for blue dye penetration in the hybrid seal in between the glass coupons. The blue dye did not penetrate into the seal and thus the assembly passed the dye test.

Sample D: In this sample, first two square ridges (~2 mm width) of inorganic enamel was deposited and fired (at 525° C. for 20 min) on a 3"×3"×3.2 mm thick bottom glass coupon. Similarly a single square ridge (~2 mm width) of inorganic enamel was deposited and fired (at 525° C. for 20 min) on a 3"×3"×3.2 mm thick top glass coupon. The positioning of these ridges were in such a way if the two glass coupons were put on top of each other in such a way the ridges are facing each other, the ridge from top glass coupon will position in between the ridges in the bottom coupon. Then at the center of the bottom glass coupon a square of thin film aluminum was evaporated (this thin aluminum will be opaque to begin with and would become transparent if attacked by moisture) for indicating the reactivity with moisture. Then in between the ridges in the bottom coupon the liquid resin LN903 (from Akzonobel) was put by syringe application. Then the top glass coupon was placed on top of bottom glass coupon to gently squeeze the liquid resin. Then the entire assembly was cured at room temperature (~25° C.) for 24 hrs to get the sealed assembly. The sealed assembly was dye tested as in examples A to C. The assembly passed the dye test. Then the dye was washed of in acetone. Then the assembly was put inside a humidity test chamber and was subjected to 85° C. and 85% RH. The unit was periodically checked for water ingress by looking at the opaqueness of the center thin film aluminum layer. After 168 hrs in 85° C./85% RH the inside aluminum turned transparent, indicating water ingress and reaction with thin film aluminum. Therefore, the organics alone seal failed after 168 hrs.

Sample F: In this sample, first two square ridges (~2 mm width) of inorganic enamel was deposited and fired (at 525° C. for 20 min) on a 3"×3"×3.2 mm thick bottom glass coupon. Similarly a single square ridge (~2 mm width) of inorganic enamel was deposited and fired (at 525° C. for 20 min) on a 3"×3"×3.2 mm thick top glass coupon. The positioning of these ridges were in such a way if the two glass coupons were put on top of each other in such a way the ridges are facing each other, the ridge from top glass coupon will position in between the ridges in the bottom coupon. Then at the center of the bottom glass coupon a square of thin film aluminum was evaporated (this thin aluminum will be opaque to begin with and would become transparent if attacked by moisture) for indicating the reactivity with moisture. Then in between the ridges in the bottom coupon a glass-flakes-filled organic hybrid solution (4 gm of liquid resin LN903, 1 gm of ECR glass flakes (Grade GF100 nm), and 3.5 gm of toluene mixed in a DAC mixer at 3500 rpm for 1 min for 5 times) was applied by syringe. Then the top glass coupon was placed on top of bottom glass coupon to gently squeeze the liquid resin. Then the entire assembly was cured at room temperature (~25° C.) for 24 hrs to get the sealed assembly. The hybrid-sealed assembly was dye tested as in examples A to C. The assembly passed the dye test. Then the dye was washed of in acetone. Then the assembly was put inside a humidity test chamber and was subjected to 85° C. and 85% RH. The unit was periodically checked for water ingress by looking at the opaqueness of the center thin film aluminum layer. Even after 744 hrs of exposure in 85° C./85% RH the inside aluminum remained opaque, indicating no water ingress. Therefore comparing Sample F with Sample D the glass-flakes-filled-organic hybrid seals withstand the water ingress at least 576 hrs longer than the organic seal alone.

The invention claimed is:
1. A method of forming a barrier, comprising:
 a. providing a glass flake loaded curable organic material comprising
  i. at least one curable organic material,
  ii. 10-95 vol% glass flakes based on the volume of organic material,
 b. applying the glass flake loaded curable organic material to at least one first substrate,
 c. subjecting the glass flake loaded curable organic material to an ultrasonic horn in order to at least partially align the flakes generally parallel to the substrate, and
 d. curing the curable organic material to form a barrier, wherein the glass flakes have an aspect ratio of 2-100 and a length of 0.1-2000 microns.
2. The method of claim 1, further comprising, prior to (d), contacting a second substrate with the at least one first substrate such that the glass flake loaded curable organic material lies therebetween.
3. The method of claim 2, wherein the barrier forms a cavity.

4. The method of claim 3, wherein an active layer is contained within the cavity.

5. The method of claim 4, wherein the active layer is selected from the group consisting of solar cell, solar cell contact, organic PV device, plasma display device, nanocrystal display, electrochromic device, electrochromic material system, suspended particle device, micro-blind, liquid crystal device, smart window, switchable window, smart glass, eglass, LED, SED, FED, OLED, LCD, DLP, FLD, IMOD, TDEL, QDLED, TMOS, TPD, LCL, LPD, and OLET.

6. The method of claim 1, wherein the glass flakes are present to an extent of 10-40 vol% and have a length of 0.5-100 microns.

7. The method of claim 1, wherein the glass flakes are present to an extent of 40-70 vol% and have a length of 0.5-100 microns.

8. The method of claim 1, wherein the average $D_{50}$ particle size of the glass flakes is 50 nanometers to 20 microns.

9. The method of claim 1, wherein, prior to (a), the glass flakes are functionalized by the application to the glass flakes of at least one selected from the group consisting of adhesion promoting primers; coupling agents; organotitanate coupling agents; silane coupling agents selected from the group consisting of, vinyl, chloropropyl, epoxy, methacrylate, primary amine, diamine, mercapto, cationic styryl, cationic methacrylate, titanate, crosslinker, mixed silanes and melamine epoxy; rubber elastomers selected from the group consisting of natural rubber, butyl rubber, styrene-butadiene rubber, nitrile rubber, and neoprene rubber, and combinations of the foregoing.

10. The method of claim 1, wherein, prior to (a), the glass flakes have been fabricated to contain at least one UV absorbing cation selected from the group consisting of titanium, cerium, transition metals and rare earth metals.

11. The method of claim 1, wherein curing is achieved by application of a localized energy source selected from the group consisting of ultrasound, visible light, ultraviolet light, broadband infrared, laser, flame induction, and combinations thereof.

12. The method of claim 1, wherein the curing is achieved by application of a dispersed energy source selected from the group consisting of thermal heating, ambient heat, ultrasound, natural gas burners, magnetic induction heating, convection furnace, and eddy currents.

13. A method of hermetically sealing an object, comprising:
  a. providing a glass flake loaded curable organic material comprising
    i. at least one curable organic material,
    ii. 40-70 vol% glass flakes based on the volume of organic material,
  b. applying the glass flake loaded curable organic material to the at least a portion of the surface of the object,
  c. subjecting the glass flake loaded curable organic material to an ultrasonic horn in order to at least partially align the flakes generally parallel to the substrate, and
  d. curing the curable organic material to form a film or sheet over at least a portion of the surface of the object,
  wherein the glass flakes have an aspect ratio of 2-100 and a length of 0.1-2000 microns.

14. The method of claim 13, wherein, prior to (a), at least one metal is coated onto the glass flakes.

15. The method of claim 14, wherein the metal is coated onto the glass flakes by a procedure selected from the group consisting of spraying, electroplating, sputtering, CVD or in situ reduction of metal salts.

* * * * *